(12) United States Patent
Yokouchi et al.

(10) Patent No.: US 11,936,156 B2
(45) Date of Patent: Mar. 19, 2024

(54) OPTICAL POWER TRANSMISSION APPARATUS

(71) Applicant: FURUKAWA ELECTRIC CO., LTD., Tokyo (JP)

(72) Inventors: Noriyuki Yokouchi, Tokyo (JP); Kengo Watanabe, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 498 days.

(21) Appl. No.: 17/148,645

(22) Filed: Jan. 14, 2021

(65) Prior Publication Data

US 2021/0135422 A1 May 6, 2021

Related U.S. Application Data

(63) Continuation of application No. PCT/JP2019/031274, filed on Aug. 7, 2019.

(30) Foreign Application Priority Data

Aug. 7, 2018 (JP) .................................. 2018-148143

(51) Int. Cl.
*H01S 3/067* (2006.01)
*H01S 3/081* (2006.01)
*H01S 5/14* (2006.01)

(52) U.S. Cl.
CPC ...... *H01S 3/06754* (2013.01); *H01S 3/06704* (2013.01); *H01S 3/0812* (2013.01); *H01S 5/146* (2013.01); *H01S 3/0675* (2013.01)

(58) Field of Classification Search
CPC .. H01S 5/146; H01S 3/06754; H01S 5/02251; H01S 5/1028; H01S 5/14
See application file for complete search history.

(56) References Cited

U.S. PATENT DOCUMENTS 6,212,310 B1  4/2001  Waarts et al.
6,275,632 B1  8/2001  Waarts et al.
(Continued)

FOREIGN PATENT DOCUMENTS

CN   101304616 A   11/2008
CN   101484850 A   7/2009
(Continued)

OTHER PUBLICATIONS

International Search Report dated Oct. 29, 2019 in PCT/JP2019/031274 filed on Aug. 7, 2019, 2 pages.
(Continued)

*Primary Examiner* — Eric L Bolda
(74) *Attorney, Agent, or Firm* — Oblon, McClelland, Maier & Neustadt, L.L.P.

(57) ABSTRACT

An optical power transmission apparatus includes: a light emitting unit including a first optical gain generating means and a first light reflecting means; an optical fiber; a second light reflecting means; and a light receiving means. Further, the second light reflecting means is arranged nearer to the light receiving means than the optical fiber is, a first laser resonator is formed, between the first light reflecting means and the second light reflecting means, by optical connection between the first optical gain generating means and the optical fiber, and first laser light generated by the first laser resonator is configured to be incident on the light receiving means.

6 Claims, 6 Drawing Sheets

(56) References Cited

U.S. PATENT DOCUMENTS

| | | | |
|---|---|---|---|
| 6,298,187 B1 | 10/2001 | Waarts et al. | |
| 6,411,323 B1 | 6/2002 | Waarts et al. | |
| 7,242,698 B2 | 7/2007 | Schwarz et al. | |
| 8,452,173 B2 | 5/2013 | Hehmann et al. | |
| 9,705,606 B2 | 7/2017 | Alpert | |
| 2003/0039024 A1* | 2/2003 | Clayton | H04B 10/299 359/326 |
| 2003/0086468 A1* | 5/2003 | Kato | H01S 5/146 372/96 |
| 2004/0001717 A1 | 1/2004 | Bennett et al. | |
| 2005/0224946 A1* | 10/2005 | Dutta | G02B 6/4257 257/686 |
| 2008/0231943 A1* | 9/2008 | Sorin | H04B 10/506 359/336 |
| 2008/0279557 A1* | 11/2008 | Park | H04J 14/02 398/79 |
| 2011/0150026 A1 | 6/2011 | Tsunekane et al. | |

FOREIGN PATENT DOCUMENTS

| | | |
|---|---|---|
| JP | 2001-037105 A | 2/2001 |
| JP | 2004-260027 A | 9/2004 |
| JP | 2005-536897 A | 12/2005 |
| JP | 2008-193327 A | 8/2008 |
| JP | 2008-283683 A | 11/2008 |
| JP | 2014-042166 A | 3/2014 |
| JP | 2018-026684 A | 2/2018 |

OTHER PUBLICATIONS

Taira et al., "Promise of Giant Pulse Micro-Laser for Engine Ignitions", J. Plasma Fusion Res., vol. 89, No. 4, 2013, 9 pages (with English Machine Translation).

Extended European Search Report dated Apr. 5, 2022, in European Patent Application No. 19847045.2, 9 pages.

Marco Presi, et al., "Stable self-seeding of R-SOAs for WDM-PONs", Optical Fiber Communication Conference and Exposition and the National Fiber Optic Engineers Conference (OFC/NFOEC 2011), XP031946272, Mar. 2011, 3 pages.

Combined Chinese Office Action and Search Report dated Jul. 1, 2023 in Chinese Application 201980051771.4, with unedited computer-generated English translation), 22 pages.

Japanese Office Action dated Jun. 20, 2023 in Japanese Patent Application No. 2020-535861 (with unedited computer-generated English translation), 7 pages.

* cited by examiner

OPTICAL POWER TRANSMISSION APPARATUS

CROSS-REFERENCE TO RELATED APPLICATION(S)

This application is a continuation of International Application No. PCT/JP2019/031274, filed on Aug. 7, 2019 which claims the benefit of priority of the prior Japanese Patent Application No. 2018-148143, filed on Aug. 7, 2018, the entire contents of which are incorporated herein by reference.

BACKGROUND

The present disclosure relates to optical power transmission apparatuses.

Power-over-fiber is an application example of optical power transmission using optical fiber. Power-over-fiber is a technology in which laser light output from a high-power laser light source is transmitted to a remote place using optical fiber, photoelectric conversion is performed at a light receiving unit and energy of the laser light is thereby converted to electric power, and an electric device is driven by the electric power. Power-over-fiber has, as compared to power supply in the related art using copper wire, many advantages including: not being electromagnetically induced and thus being resistant to noise and not generating noise; high resistance to thunderstrokes; not having electrical contacts and thus being usable even under highly humid environments; and being explosion proof. Such optical power transmission has been studied for ignition devices in internal combustion engines of automobiles, for example (TAIRA Takunori, et al., "Promise of Giant Pulse Micro-Laser for Engine Ignition", J. Plasma Fusion Res. Vol. 89, No. 4, pp. 238, 2013).

However, there is a risk that any laser light that leaks outside and radiates from the power supply path may harm human bodies and surrounding objects. Japanese Laid-open Patent Publication Nos 2001-37105 discloses a configuration, in which voltage output from a photoelectric conversion means is detected and an optical power stopping means that immediately stops the laser power source if an abnormality is detected operates to avoid such a risk.

Furthermore, Japanese Laid-open Patent Publication No. 2008-193327 similarly discloses a technique, in which signal light including error information is transmitted from a light receiving end to a light emitting end if an appropriate signal is unable to be received at the receiving end, and driving of a laser light source for power supply is stopped according to an instruction from a control unit.

Optical wireless power supply technologies not using optical fiber include a technology, in which a laser resonator is formed between a light emitting unit and a light receiving unit, the light emitting unit including a combination of a retroreflector and a gain means, the light receiving unit including a combination of a retroreflector and a light receiving means, and laser oscillation is thereby immediately stopped when a shielding object, such as a human body, is inserted into the optical path of the resonator, as disclosed in U.S. Pat. No. 9,705,606.

However, for power-over-fiber, the method of detecting an abnormality at a light receiving end and feeding back the abnormality to a light emitting end, as disclosed in Japanese Laid-open Patent Publication Nos. 2001-37105 and 2008-193327, additionally requires an abnormality detecting means and a circuit for stopping the operation of the laser light source and the system configuration may thus become complex. Furthermore, this method involves processing including abnormality detection and signal processing, and thus has a problem that laser oscillation may occur due to a malfunction in the mechanism implementing the processing, such as the abnormality detection or the signal processing, even if laser oscillation is supposed to be stopped.

In contrast, the optical wireless power supply system described in U.S. Pat. No. 9,705,606 maintains higher safety. However, when the distance between the light emitting unit and the light receiving unit is increased, power transmission loss is dramatically increased and laser oscillation will no longer occur. A practical power transmission distance therefor would thus be a few meters. Furthermore, if there is an obstacle between the light emitting unit and the light receiving unit, optical power is unable to be transmitted, and the environment for their installation is thus limited to a small line-of-sight space.

SUMMARY

There is a need for providing an optical power transmission apparatus that maintains a high level of safety with a noncomplex configuration and enables optical power transmission over a long distance or to a non-line-of-sight place.

According to an embodiment, an optical power transmission apparatus includes: a light emitting unit including a first optical gain generating means and a first light reflecting means; an optical fiber; a second light reflecting means; and a light receiving means. Further, the second light reflecting means is arranged nearer to the light receiving means than the optical fiber is, a first laser resonator is formed, between the first light reflecting means and the second light reflecting means, by optical connection between the first optical gain generating means and the optical fiber, and first laser light generated by the first laser resonator is configured to be incident on the light receiving means.

DETAILED DESCRIPTION

Figure 1:
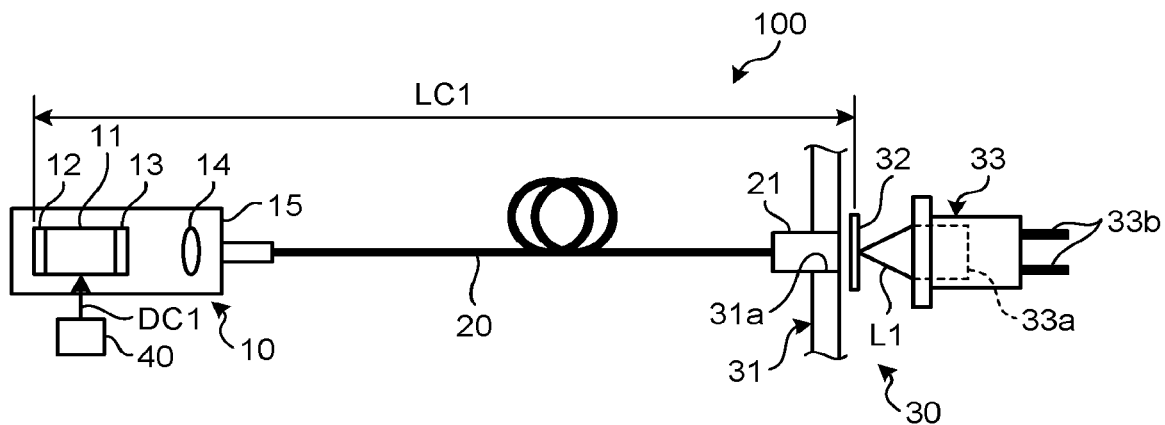
FIG. 1 is a diagram illustrating a schematic configuration of an optical power transmission apparatus according to a first embodiment.

Hereinafter, embodiments of the present disclosure will be described in detail while reference is made to the appended drawings. The present disclosure is not limited by the embodiments described below. Furthermore, the same signs will be assigned, as appropriate, to the same or corresponding elements in the drawings, and redundant description thereof will be omitted, as appropriate. In addition, it needs to be noted that the drawings are schematic, and relations among dimensions of the elements therein may be different from the actual relations. A portion having different dimensional relations and ratios among the drawings may be included, too.

First Embodiment

FIG. 1 is a diagram illustrating a schematic configuration of an optical power transmission apparatus according to a first embodiment. An optical power transmission apparatus 100 includes a light emitting unit 10, an optical fiber 20, a light receiving unit 30, and a driving device 40. The driving device 40 is an energy supplying means.

The light emitting unit 10 includes: a semiconductor optical amplifier 11; a reflecting mirror 12; a low-reflecting coating 13; a lens 14; and a housing 15. The semiconductor optical amplifier 11 is a first optical gain generating means, and the reflecting mirror 12 is a first light reflecting means.

The driving device 40 is a known driving device configured to be able to drive the semiconductor optical amplifier 11. The driving device 40 supplies driving current DC1 serving as energy, to the semiconductor optical amplifier 11.

The semiconductor optical amplifier 11 according to this embodiment has a strained quantum well structure formed as an active layer, on a gallium arsenide (GaAs) substrate. The strained quantum well structure includes a constituent material that is GaInAs, which is a semiconductor material. The width of an active region including an active layer in the semiconductor optical amplifier 11 is configured to be a width enabling single-mode waveguiding, for example, 2 µm. The semiconductor optical amplifier 11 is a diced chip obtained by cleavage of a wafer into chips each having a length of 1 mm in the optical waveguiding direction. The semiconductor optical amplifier 11 emits light by being supplied with the driving current DC1 from the driving device 40 and generates optical gain. The semiconductor optical amplifier 11 is configured by adjustment of the composition or the like of the strained quantum well structure such that the semiconductor optical amplifier 11 has a gain wavelength band including 980 nm.

The reflecting mirror 12 is formed on one of cleaved facets of the semiconductor optical amplifier 11, the cleaved facets both being on an optical waveguiding path of the semiconductor optical amplifier 11. The reflecting mirror 12 is, for example, a dielectric multilayer coating and is configured to have a high reflectivity of 95% at 980 nm included in the gain wavelength band of the semiconductor optical amplifier 11.

The low-reflecting coating 13 is formed on the other one of the cleaved facets such that the low-reflecting coating 13 is opposed to the reflecting mirror 12 with the semiconductor optical amplifier 11 interposed between the low-reflecting coating 13 and the reflecting mirror 12, the cleaved facets both being on the optical waveguiding path. The low-reflecting coating 13 is, for example, a dielectric multilayer coating and is configured to have a very low reflectivity of 0.1% at the wavelength of 980 nm. The lens 14 is arranged on one side of the low-reflecting coating 13, the one side being opposite to where the semiconductor optical amplifier 11 is. The lens 14 optically couples light generated by the semiconductor optical amplifier 11 and output via the low-reflecting coating 13, to one end of the optical fiber 20.

The housing 15 is a housing that houses the semiconductor optical amplifier 11, the reflecting mirror 12, the low-reflecting coating 13, and the lens 14, and is made of, for example, a metallic material. Furthermore, the one end of the optical fiber 20 is connected to the housing 15.

The optical fiber 20 connects the light emitting unit 10 and the light receiving unit 30 to each other, and is, according to this embodiment, a single-mode optical fiber (SMF). The one end of the optical fiber 20 is processed into a lens shape, the one end being connected to the housing 15, and is, as described above, optically connected, at the facet where the low-reflecting coating 13 is formed, to the semiconductor optical amplifier 11, via the lens 14. A connector 21 is provided at the other end of the optical fiber 20 and the connector 21 is connected to the light receiving unit 30. The connector 21 is formed of a known ferrule or optical connector. The other end of the optical fiber 20 is polished such that a return loss becomes equal to or greater than 30 dB (that is, a reflectivity becomes equal to or less than 0.1%), the other end being where the connector 21 is provided. The connector 21 corresponds to a first fixing unit that the optical fiber 20 has near the light receiving unit 30.

The light receiving unit 30 includes a housing 31, a reflecting mirror 32, and a light receiving module 33. The reflecting mirror 32 is a second light reflecting means.

The housing 31 is a housing that houses the reflecting mirror 32 and the light receiving module 33, and is made of, for example, a metallic material. Furthermore, the housing 31 has a connector connecting unit 31a provided therein. The connector 21 is connectable to the connector connecting unit 31a. The optical fiber 20 is connected to the light receiving unit 30 by connection of the connector 21 to the connector connecting unit 31a. The connector 21 may be detachably connected to the connector connecting unit 31a or may be bonded to the connector connecting unit 31a.

The reflecting mirror 32 is arranged near the connector connecting unit 31a. Specifically, the reflecting mirror 32 is arranged such that a reflecting surface of the reflecting mirror 32 is opposed to the other end of the optical fiber 20 at a short distance, for example, at a short distance where the reflecting surface substantially touches the other end, in a state where the connector 21 has been connected to the connector connecting unit 31a. The optical fiber 20 and the reflecting mirror 32 are thereby optically connected to each other. Therefore, the connector connecting unit 31a corresponds to a second fixing unit placed at a predetermined position (at the light receiving unit 30 according to this embodiment), the predetermined position enabling optical connection between the optical fiber 20 and the reflecting mirror 32. The connector 21 serving as the first fixing unit is connected to the connector connecting unit 31a serving as the second fixing unit. The reflecting mirror 32 is, for example, an optical plate (such as a glass plate) having a dielectric multilayer coating formed thereon, for example, and is configured to transmit a large proportion of light and have a reflectivity of 5%, at the wavelength of 980 nm.

The light receiving module 33 includes a light receiving element 33a and an output terminal 33b. The light receiving element 33a is a photoelectric conversion element that converts light received, into electric current of quantity corresponding to the received power of the light, and is, for example, a photodiode. A low-reflecting coating is preferably formed on a light receiving surface of the light receiving element 33a. The output terminal 33b is electrically connected to the light receiving element 33a and is a terminal for outputting electric current. In this embodiment, the light receiving element 33a includes a semiconductor material having silicon (Si) as a main constituent, and is made of, for example, Si. The semiconductor material having Si as the main constituent is a semiconductor material, in which 50% or more of its composition is Si, for example, in which 99% or more of its composition is Si, and 1% or less of its composition corresponds to other impurities. Light receiving sensitivity of Si to light of a wavelength near 1000 nm, such as the wavelength of 980 nm, is high and Si is inexpensive.

By being optically connected in the order of the reflecting mirror 12, the optical fiber 20, and the reflecting mirror 32; the reflecting mirror 12, the optical fiber 20, and the reflecting mirror 32 form a laser resonator LC1 at the wavelength of 980 nm. The laser resonator LC1 is a first laser resonator. The semiconductor optical amplifier 11 is arranged in the laser resonator LC1.

Operation of the optical power transmission apparatus 100 will now be described. Firstly, the driving device 40 supplies the driving current DC1, to the semiconductor optical amplifier 11. The semiconductor optical amplifier 11 then emits light of a wavelength in a gain bandwidth of the semiconductor optical amplifier 11 and generates optical gain. In the state where the semiconductor optical amplifier 11 is generating the optical gain, laser oscillation is then caused by the laser resonator LC1, and laser light L1 generated by the laser oscillation is output from the laser resonator LC1, in the light receiving unit 30. The laser light L1 is first laser light. Specifically, in the light receiving unit 30, the laser light L1 is output from the reflecting mirror 32 forming one end of the laser resonator LC1. That is, the optical power transmission apparatus 100 is configured to output the laser light L1 generated by the laser resonator LC1, from the laser resonator LC1, in the light receiving unit 30. As a result, high optical power due to the laser oscillation is transmitted as the laser light L1, via the optical fiber 20, from the light emitting unit 10 to the light receiving unit 30. In the light receiving module 33, the light receiving element 33a receives and photoelectrically converts the laser light L1, and the converted electric current is output from the output terminal 33b.

Figure 2:
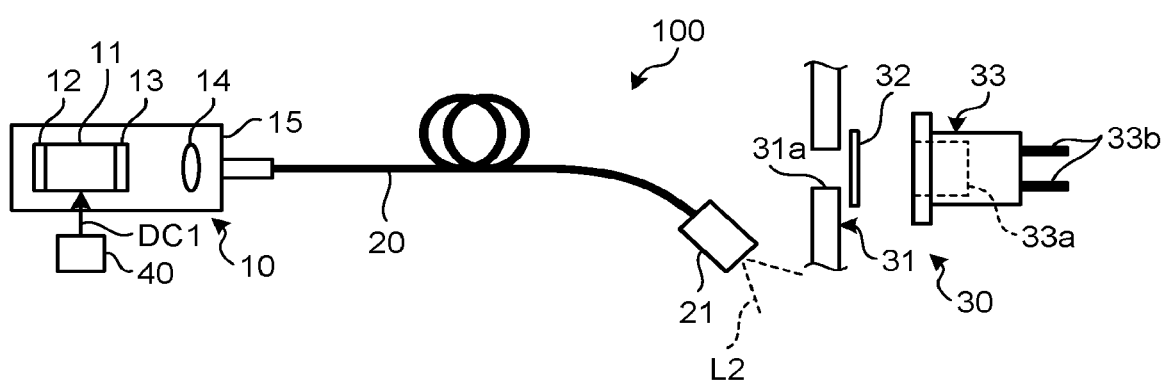
FIG. 2 is a diagram illustrating the optical power transmission apparatus in FIG. 1 in a state where laser oscillation is stopped.

As illustrated in FIG. 2, when the connector 21 is detached from the connector connecting unit 31a, the optical connection between the reflecting mirror 12, the optical fiber 20, and the reflecting mirror 32 is cancelled. In this case, the laser resonator LC1 is not formed. As a result, laser oscillation does not occur, and light L2 low in power without laser oscillation is output from the connector 21 of the optical fiber 20.

As described above, in the optical power transmission apparatus 100, in the state where laser oscillation by the laser resonator LC1 is occurring, high optical power is transmitted, and in the state where the laser resonator LC1 has not been formed, laser oscillation does not occur and the light L2 low in power is output. Therefore, in this optical power transmission apparatus 100, if an abnormality occurs, for example, in a case where the connector 21 of the optical fiber 20 is detached, the connector 21 connecting the light emitting unit 10 and the light receiving unit 30 to each other, laser oscillation is automatically stopped. Accordingly, with a noncomplex configuration not having an abnormality detecting means in the light receiving unit nor a stopping means in the light emitting unit, laser light is prevented from leaking outside and a high level of safety is able to be maintained. Furthermore, the use of the optical fiber 20 enables safe power supply or power transmission to a remote place or a non-line-of-sight place, to which power supply or power transmission is not made possible by optical wireless power supply.

Example and Comparative Example

Figure 3:
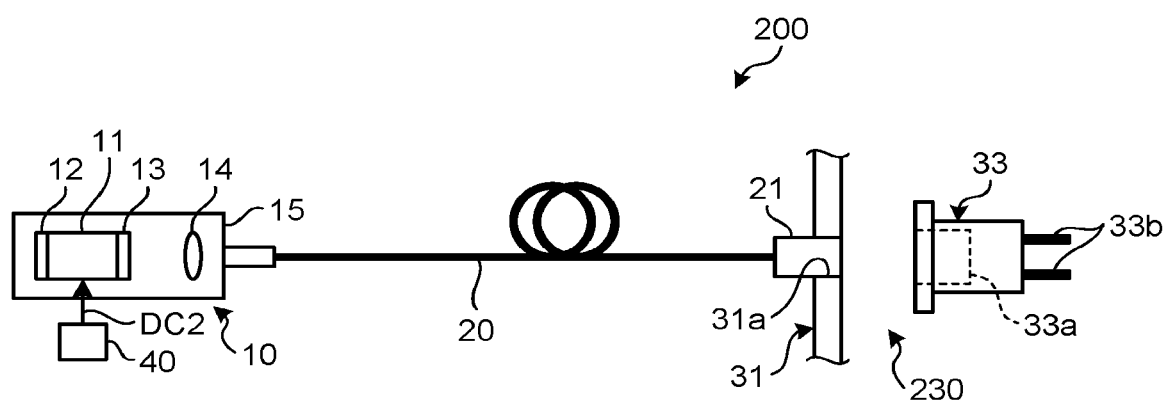
FIG. 3 is a diagram illustrating a schematic configuration of an optical power transmission apparatus as Comparative Example.

As Example, an optical power transmission apparatus having the same configuration as the optical power transmission apparatus 100 according to the first embodiment was manufactured, and driving current was supplied to its semiconductor optical amplifier for measurement of characteristics thereof. Furthermore, as Comparative Example, an optical power transmission apparatus having the same configuration as an optical power transmission apparatus 200 illustrated in FIG. 3 was manufactured, and driving current was supplied to its semiconductor optical amplifier for measurement of characteristics thereof. The optical power transmission apparatus 200 has a light receiving unit 230 having a configuration corresponding to the light receiving unit 30 of the optical power transmission apparatus 100, with the reflecting mirror 32 eliminated from the light receiving unit 30.

Figure 4:
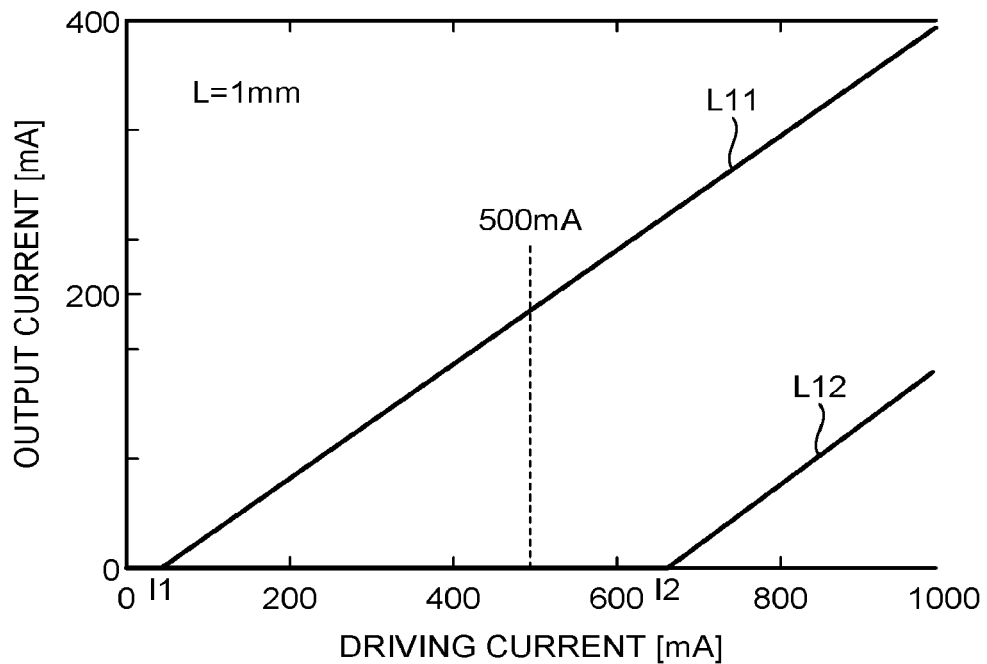
FIG. 4 is a diagram illustrating an example of relations between driving current and output current.

FIG. 4 is a diagram illustrating an example of relations between driving current and output current of the light receiving units. In FIG. 4, the horizontal axis corresponds to driving current supplied to the semiconductor optical amplifiers and the vertical axis corresponds to output current from the light receiving modules in the light receiving units. As indicated by a line L11, in Example, laser oscillation occurred and output current was generated, when the driving current exceeded a current I1 (about 50 mA). When the driving current was about 500 mA, output current of about 200 mA, that is, electric power of about 150 mW assuming the voltage to be 0.75 V, was acquired in the light receiving unit.

On the contrary, as indicated by a line L12, in Comparative Example, it was confirmed that laser oscillation did not occur and output current was not generated when the driving current was just about 500 mA. This is considered to indicate that at a driving current of about 500 mA, in a state where a laser resonator has not been formed, like in a case where the connector of the optical fiber has been detached, laser oscillation is automatically stopped and leakage to the outside does not occur.

In Comparative Example also, laser oscillation occurs when the driving current exceeds a current I2 (about 650 mA). Therefore, to maintain safety more infallibly, the driving device preferably controls the driving current by being configured to supply electric current of values: in a range where laser oscillation occurs in a case where predetermined optical connection has been achieved and a laser resonator has been formed; and in a range where laser oscillation does not occur in a state where the predetermined optical connection has been cancelled and the laser resonator has not been formed.

Figure 5:
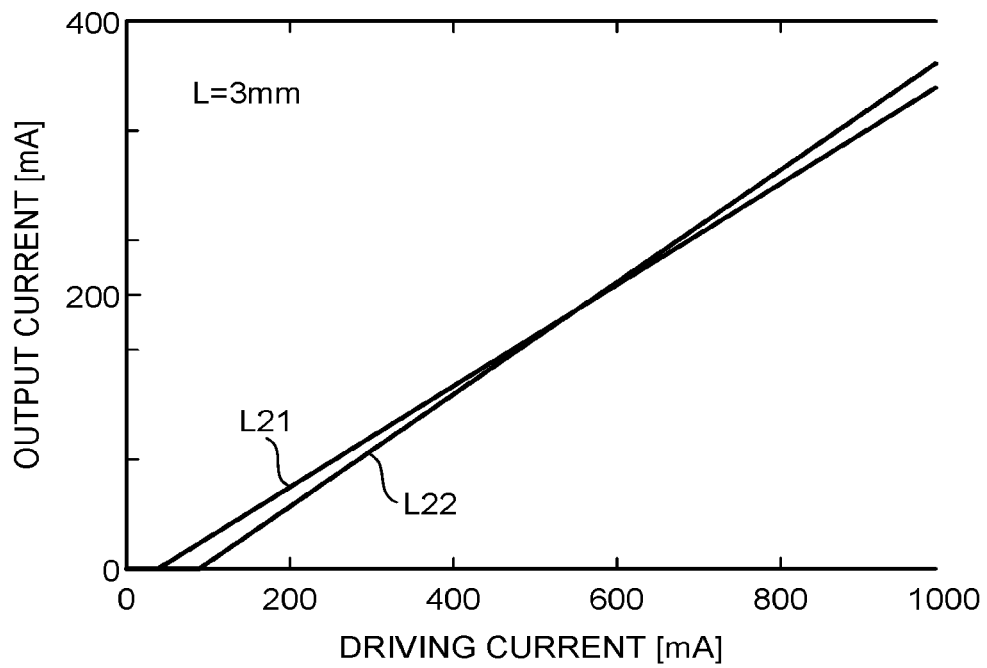
FIG. 5 is a diagram illustrating another example of the relations between driving current and output current.

Next, FIG. 5 is a diagram illustrating another example of the relations between driving current and output current. Lines L21 and L22 respectively indicate the relations for optical power transmission apparatuses corresponding to the above described optical power transmission apparatuses of Example and Comparative Example, with 1-mm chips of their semiconductor optical amplifiers replaced with 3-mm chips, the 1-mm chips each having a length of 1 mm in the optical waveguiding direction, the 3-mm chips each having a length of 3 mm in the optical waveguiding direction. As illustrated in FIG. 5, when the lengths of the semiconductor optical amplifiers are 3 mm, the relations between the driving current and the output current are not much different from each other. That is, in a state where the driving current is equal to or less than 100 mA, the output current starts to increase, and at a driving current of 500 mA, an output current of about 200 mA has been acquired.

This is considered to be caused because when the semiconductor optical amplifiers are long, the gain is also high, and thus even if there is no reflection by the reflecting mirrors in the light receiving units, laser oscillation is caused by influence of the reflection (for example, of a reflectivity of 0.1%) at the low-reflecting coatings of the semiconductor optical amplifiers, for example. Therefore, the driving current and the gain of the semiconductor optical amplifier need to be set appropriately, for example, for a configuration enabling laser oscillation by the first laser resonator. Furthermore, optical fiber has transmission loss dependent on wavelength, and the value of the transmission loss is, for example, about 3 dB/km at the wavelength of 980 nm. Therefore, if an optical fiber having a length making its transmission loss non-negligible is used, a condition necessary for laser oscillation becomes severer, for example, the reflectivity of the reflecting mirror in the light receiving unit becomes higher. Accordingly, there is an appropriate reflectivity for a length of optical fiber. These various parameters affecting laser oscillation in the first laser resonator are desirably set as appropriate such that laser oscillation is caused by the first laser resonator according to: a transmission distance; electric output required at the light receiving unit; electric power consumption allowed at the light emitting unit; and the like.

In this embodiment, the reflecting mirror 32, which is the second light reflecting means, is an optical plate having a dielectric multilayer coating formed thereon, but the second light reflecting means is not limited to such an optical plate, and may be a dielectric multilayer coating formed on the light receiving surface of the light receiving element 33a.

Second Embodiment

Figure 6:
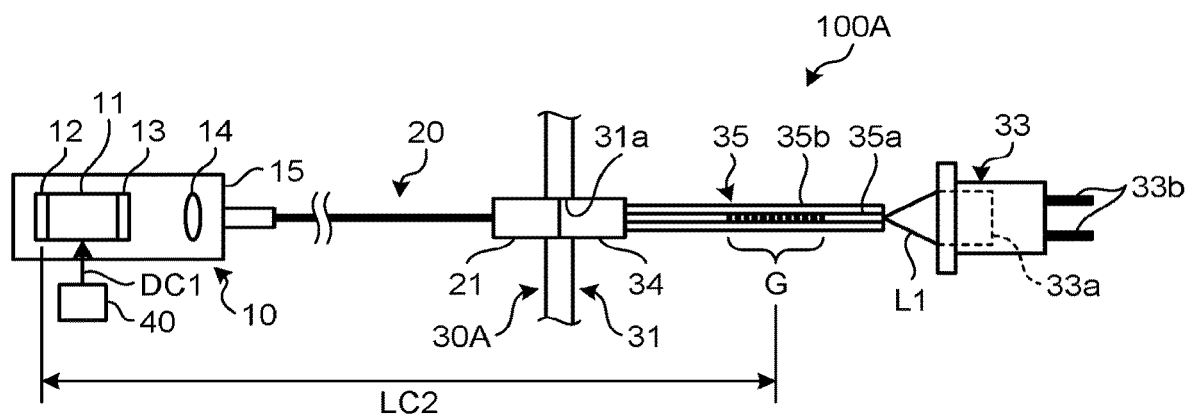
FIG. 6 is a diagram illustrating a schematic configuration of an optical power transmission apparatus according to a second embodiment.

FIG. 6 is a diagram illustrating a schematic configuration of an optical power transmission apparatus according to a second embodiment. An optical power transmission apparatus 100A has a configuration corresponding to the configuration of the optical power transmission apparatus 100 illustrated in FIG. 1, with the light receiving unit 30 replaced with a light receiving unit 30A.

The light receiving unit 30A has a configuration corresponding to the light receiving unit 30 of the optical power transmission apparatus 100, with the reflecting mirror 32 replaced with a connector 34 and a fiber Bragg grating (FBG) 35.

The connector 34 is provided at one end of the FBG 35. The connector 34 is formed of a known ferrule or optical connector and is connected to the connector connecting unit 31a of the housing 31, so as to be opposed to the connector 21. The FBG 35 and the optical fiber 20 are thereby optically connected to each other. The connector 34 may be detachably connected to the connector connecting unit 31a or may be bonded to the connector connecting unit 31a. The one end of the FBG 35 is polished such that a return loss becomes equal to or greater than 30 dB, the one end being where the connector 34 is provided.

The FBG 35 is an SMF having a core 35a and a cladding 35b, and a grating G with a periodic refractive index profile is formed in the core 35a. The grating G is configured to Bragg-reflect a specific wavelength, and in this embodiment, is configured to transmit a large proportion of light and have a reflectivity of 5%, at the wavelength of 980 nm. This FBG 35 functions as a second light reflecting means. The other end of the FBG 35 is opposed to the light receiving surface of the light receiving element 33a of the light receiving module 33, and the FBG 35 and the light receiving element 33a are optically connected to each other.

In the optical power transmission apparatus 100A, by being optically connected in the order of the reflecting mirror 12 of the light emitting unit 10, the optical fiber 20, and the FBG 35; the reflecting mirror 12, the optical fiber 20, and the FBG 35 form a laser resonator LC2 at the wavelength of 980 nm. The laser resonator LC2 is a first laser resonator. The semiconductor optical amplifier 11 is arranged in the laser resonator LC2.

The optical power transmission apparatus 100A operates similarly to the optical power transmission apparatus 100. That is, firstly, the driving device 40 supplies the driving current DC1 to the semiconductor optical amplifier 11. In the state where the semiconductor optical amplifier 11 is generating optical gain, laser oscillation is caused by the laser resonator LC2, and laser light L1 generated by the laser oscillation is output in the light receiving unit 30A from the FBG35 of the laser resonator LC2. As a result, high optical power due to the laser oscillation is transmitted as laser light L1, via the optical fiber 20, from the light emitting unit 10 to the light receiving unit 30. In the light receiving module 33, the light receiving element 33a receives and photoelectrically converts the laser light L1, and the converted electric current is output from the output terminal 33b. When the connector 21 or the connector 34 is detached from the connector connecting unit 31a, the laser resonator LC2 is not formed and laser oscillation does not occur.

Therefore, similarly to the optical power transmission apparatus 100, the optical power transmission apparatus 100A enables, with a noncomplex configuration, laser light to be prevented from leaking outside, a high level of safety to be maintained, and safe power supply or power transmission to a remote place or a non-line-of-sight place to be accomplished.

Third Embodiment

Figure 7:
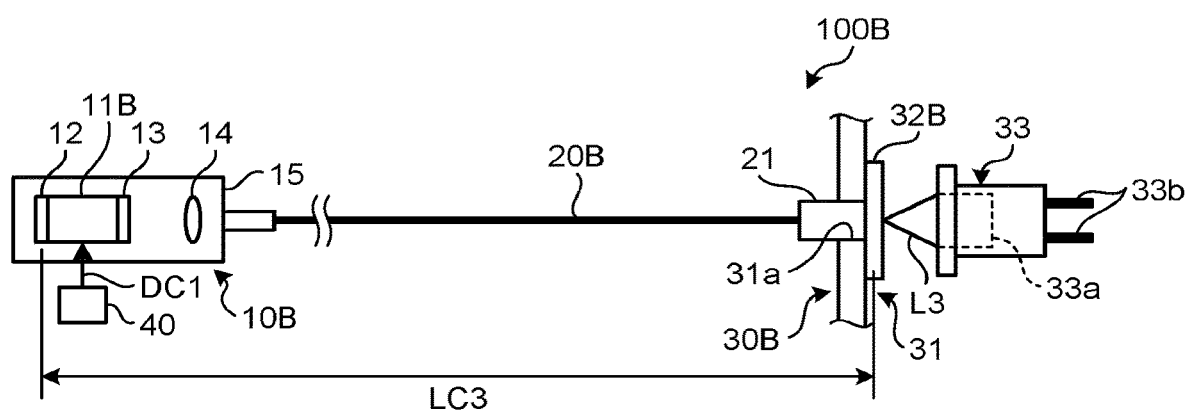
FIG. 7 is a diagram illustrating a schematic configuration of an optical power transmission apparatus according to a third embodiment.

FIG. 7 is a diagram illustrating a schematic configuration of an optical power transmission apparatus according to a third embodiment. An optical power transmission apparatus 100B has a configuration corresponding to the configuration of the optical power transmission apparatus 100 illustrated in FIG. 1, with the light emitting unit 10 replaced with a light emitting unit 10B, the optical fiber 20 replaced with an optical fiber 20B, and the light receiving unit 30 replaced with a light receiving unit 30B.

The light emitting unit 10B has a configuration corresponding to the configuration of the light emitting unit 10, with the semiconductor optical amplifier 11 replaced with a semiconductor optical amplifier 11B. The semiconductor optical amplifier 11B is made of a material similar to that of the semiconductor optical amplifier 11 and has a structure similar to that of the semiconductor optical amplifier 11, but the width of its active region is set to a width enabling multi-mode waveguiding, for example, 100 µm.

The optical fiber 20B is a multi-mode optical fiber (MMF) and has a core diameter of, for example, 100 µm.

The light receiving unit 30B has a configuration corresponding to the configuration of the light receiving unit 30 of the optical power transmission apparatus 100, with the reflecting mirror 32 replaced with a volume Bragg grating (VBG) 32B.

The VBG 32B is a large-area diffraction grating, and is configured to transmit a large proportion of light and have a reflectivity of 5%, at the wavelength of 980 nm. This VBG 32B functions as a second light reflecting means. The VBG 32B is provided on an inner wall of the housing 31, for example, is opposed to the light receiving surface of the light receiving element 33a with a predetermined distance from the light receiving surface, and the VBG 32B and the light receiving element 33a are optically connected to each other.

In the optical power transmission apparatus 100B, by being optically connected in the order of the reflecting mirror 12 of the light emitting unit 10B, the optical fiber 20B, and the VBG 32B; the reflecting mirror 12, the optical fiber 20B, and the VBG 32B form a laser resonator LC3 at the wavelength of 980 nm. The laser resonator LC3 is a first laser resonator. The semiconductor optical amplifier 11B is arranged in the laser resonator LC3.

The optical power transmission apparatus 100B operates similarly to the optical power transmission apparatus 100. That is, in the state where the semiconductor optical amplifier 11B is being supplied with the driving current DC1 from the driving device 40 and generating optical gain, laser oscillation is caused by the laser resonator LC3, and laser light L3 generated by the laser oscillation is output from the VBG 32B. As a result, high optical power due to the laser oscillation is transmitted as the laser light L3, via the optical fiber 20B, from the light emitting unit 10B to the light receiving unit 30B.

In particular, in the optical power transmission apparatus 100B, because the width of the active region in the semiconductor optical amplifier 11B is set to a width enabling multi-mode waveguiding and the optical fiber 20B is an MMF, very high optical power of, for example, more than 1 W, is transmitted as the laser light L3.

In a light receiving module 33B, the light receiving element 33a receives and photoelectrically converts the laser light L3, and the converted electric current is output from the output terminal 33b. When the connector 21 is detached from the connector connecting unit 31a, the laser resonator LC3 is not formed and laser oscillation does not occur.

Furthermore, in the optical power transmission apparatus 100B, because the VBG 32B is separate from the light receiving surface of the light receiving element 33a by a predetermined distance, the beam diameter of the laser light L3 at the light receiving surface is able to be made sufficiently larger than the core diameter of the optical fiber 20B. As a result, the optical power density at the light receiving surface is able to be reduced and damage to the light receiving surface of the light receiving element 33a is able to be avoided. The distance between the VBG 32B and the light receiving surface of the light receiving element 33a is preferably set as appropriate, based on: the resistance of the light receiving element 33a to the optical power density; and the power of the laser light L3.

Furthermore, when the optical fiber 20B is an MMF, formation of a grating in the core is often difficult generally, and thus use of the VBG 32B is effective.

Similarly to the optical power transmission apparatus 100, the optical power transmission apparatus 100B enables, with a noncomplex configuration, laser light to be prevented from leaking outside, a high level of safety to be maintained, and safe power supply or power transmission to a remote place or to a non-line-of-sight place to be accomplished.

In the above described embodiments, the photoelectric conversion element includes a semiconductor material having Si as a main constituent. However, the material forming the photoelectric conversion element is not limited to this semiconductor material, and may be selected, as appropriate, according to a wavelength received or the like.

For example, the photoelectric conversion element may include a semiconductor material lattice matched with gallium arsenide (GaAs). Being lattice-matched herein includes both being unstrained lattice matched and being strained lattice matched. Examples of the semiconductor material lattice matched with GaAs include GaAs and AlGaAs. A configuration having a GaAs layer or an AlGaAs layer formed as an absorption layer on a GaAs substrate may be adopted as a configuration of the photoelectric conversion element. The photoelectric conversion element including the semiconductor material lattice matched with GaAs enables the photoelectric conversion efficiency for light of a wavelength near 1000 nm, such as 980 nm, to be increased.

Furthermore, the photoelectric conversion element may include a semiconductor material lattice matched with indium phosphide (InP). Examples of the semiconductor material lattice matched with InP include GaInAsP and AlGaInAs. A configuration having GaInAsP layers or AlGaInAs layers formed as an absorption layer on an InP substrate may be adopted as a configuration of the photoelectric conversion element. The photoelectric conversion element including the semiconductor material lattice matched with InP enables the photoelectric conversion efficiency for light of a wavelength range near 1550 nm, which is one of communication wavelength ranges, to be increased.

Fourth Embodiment

Figure 8:
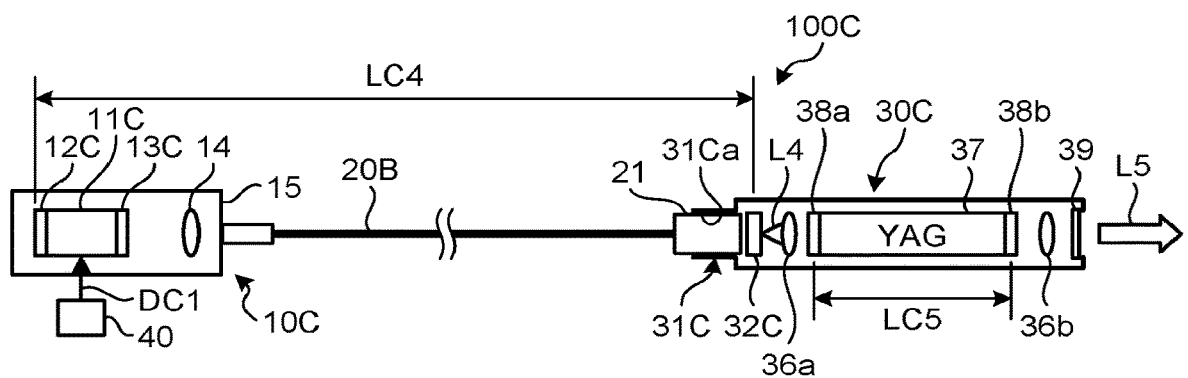
FIG. 8 is a diagram illustrating a schematic configuration of an optical power transmission apparatus according to a fourth embodiment.

An optical power transmission apparatus that uses, as is, light transmitted through an optical fiber, without converting the optical power into electricity, will be described as a fourth embodiment. FIG. 8 is a diagram illustrating a schematic configuration of the optical power transmission apparatus according to the fourth embodiment. An optical power transmission apparatus 100C has a configuration corresponding to the configuration of the optical power transmission apparatus 100B illustrated in FIG. 7, with the light emitting unit 10B replaced with a light emitting unit 10C and the light receiving unit 30B replaced with a light receiving unit 30C.

The light emitting unit 10C has a configuration corresponding to the configuration of the light emitting unit 10B, with the semiconductor optical amplifier 11B replaced with a semiconductor optical amplifier 11C, the reflecting mirror 12 replaced with a reflecting mirror 12C, and the low-reflecting coating 13 replaced with a low-reflecting coating 13C.

The semiconductor optical amplifier 11C is made of a material similar to that of the semiconductor optical amplifier 11B and has a structure similar to that of the semiconductor optical amplifier 11B, but the composition of the material and the structure are adjusted such that the semiconductor optical amplifier 11C has a gain wavelength band including 808 nm. The reflecting mirror 12C is, for example, a dielectric multilayer and is configured to have a high reflectivity of 95% at 808 nm included in the gain wavelength band of the semiconductor optical amplifier 11C. The low-reflecting coating 13C is, for example, a dielectric multilayer coating and is configured to have a very low reflectivity of 0.1% at the wavelength of 808 nm.

The light receiving unit 30C includes a housing 31C, a VBG 32C, lenses 36a and 36b, a microchip 37, reflecting coatings 38a and 38b, and an output window 39. The microchip 37 is a second optical gain generating means.

The housing 31C is a cylindrical housing that houses the VBG 32C, the lenses 36a and 36b, the microchip 37, the reflecting coatings 38a and 38b, and the output window 39, and is made of, for example, a metallic material. A connector connecting unit 31Ca connectable to the connector 21 is provided at one end of the housing 31C.

The VBG 32C is configured to transmit a large proportion of light and have a reflectivity of 5%, at the wavelength of 808 nm. The VBG 32C is opposed to one end of the optical fiber 20B, the one end being where the connector 21 is provided.

By being optically connected in the order of the reflecting mirror 12C of the light emitting unit 10C, the optical fiber 20B, and the VBG 32C; the reflecting mirror 12C, the optical fiber 20B, and the VBG 32C form a laser resonator LC4 at the wavelength of 808 nm. The laser resonator LC4 is a first laser resonator. The semiconductor optical amplifier 11C is arranged in the laser resonator LC4. In a state where the semiconductor optical amplifier 11C is being supplied with the driving current DC1 from the driving device 40 and generating optical gain, laser oscillation is caused by the laser resonator LC4, and laser light L4 generated by the laser oscillation is output from the VBG 32C. As a result, high optical power due to the laser oscillation is transmitted as the laser light L4, via the optical fiber 20B, from the light emitting unit 10C to the light receiving unit 30C. The lens 36a is arranged to be opposed to the VBG 32C.

The lens 36a functions an optical system that causes the laser light L4 to enter the microchip 37.

The microchip 37 is formed of an optical material including yttrium aluminum garnet (YAG), and in this embodiment, is made of YAG.

The reflecting coatings 38a and 38b are respectively provided on opposite facets of the microchip 37, and are, for example, dielectric multilayer coatings. The reflecting coating 38a transmits most of the laser light L4 of the wavelength 808 nm, and reflects light of a wavelength of 1064 nm at a high reflectivity (of, for example, 95% or more). The reflecting coating 38b is configured to transmit a large proportion of light and have a reflectivity of 50%, at the wavelength of 1064 nm.

The reflecting coatings 38a and 38b form a laser resonator LC5 that functions at the wavelength of 1064 nm. The laser resonator LC5 is a second laser resonator. The microchip 37 is arranged in the laser resonator LC5. The microchip 37 emits light of the wavelength of 1064 nm and generates optical gain, by receiving the laser light L4 transmitted through the reflecting coating 38a, the laser light L4 serving as excitation light. Laser oscillation is then caused by the laser resonator LC5, and laser light L5 of the wavelength of 1064 nm generated by the laser oscillation is output from the reflecting coating 38b of the laser resonator LC5. The laser light L5 is second laser light. That is, the reflecting coatings 38a and 38b and the microchip 37 function as a YAG laser unit.

The lens 36b is arranged to be opposed to the reflecting coating 38b, and functions as a condensing optical system that condenses the laser light L5. The output window 39 is an optical window arranged, at the other end of the housing 31C, to be opposed to the lens 36b, and transmits the laser light L5 to output the laser light L5 outside.

As described above, in the optical power transmission apparatus 100C, the laser resonator LC4 forms an excitation laser light generating unit for the YAG laser unit.

Similarly to the optical power transmission apparatus 100, the optical power transmission apparatus 100C enables, with a noncomplex configuration, laser light L4 to be prevented from leaking outside, a high level of safety to be maintained, and safe power supply or power transmission to a remote place or to a non-line-of-sight place to be accomplished.

This optical power transmission apparatus 100C may be suitably used as, for example, an ignition device in an internal combustion engine. Because YAG lasers are able to generate pulsed laser light having very high peak power by pulse excitation, they achieve higher combustion efficiency in internal combustion engines. Examples of a method of providing laser light L4 and laser light L5 as pulsed laser light in the optical power transmission apparatus 100C include a method of providing, as pulsed current, the driving current DC1 supplied from the driving device 40 to the semiconductor optical amplifier 11C. When this optical power transmission apparatus 100C is used as an ignition device, and, for example, the connector 21 is loosened or the light receiving unit 30C is replaced, the replacement corresponding to replacement of the ignition plug, output of the laser light L4 and laser light L5 is automatically stopped and safety is thus maintained.

Space for installation of the light emitting unit 10C near an internal combustion engine may be unable to be obtained. This optical power transmission apparatus 100C has an advantage because the light emitting unit 10C is installed at an installable place and optical power is able to be transmitted from that installable place through the optical fiber 20B to the light receiving unit 30C installed in an internal combustion engine.

In this embodiment, the microchip 37, which is the second optical gain generating means, is made of YAG, but a material forming the second optical gain generating means is not limited to YAG, may be yttrium vanadate (YVO), and may be selected as appropriate according to, for example, a desired laser oscillation wavelength.

For example, the second optical gain generating means may include a semiconductor material lattice matched with GaAs. Examples of the semiconductor material lattice matched with GaAs include GaAs, AlGaAs, InGaAs, and AlInGaP. A configuration having a GaAs layer, an AlGaAs layer, an InGaAs layer, or an AlInGaP layer formed as a light emitting layer on a GaAs substrate may be adopted as a configuration of the second optical gain generating means. The second optical gain generating means including the semiconductor material lattice matched with GaAs is suitable for laser oscillation of a wavelength near 1000 nm, such as 980 nm.

Furthermore, the second optical gain generating means may include a semiconductor material lattice matched with InP. Examples of the semiconductor material lattice matched with InP include GaInAsP and AlGaInAs. A configuration having GaInAsP layers or AlGaInAs layers formed as a light emitting layer on an InP substrate may be adopted as a configuration of the second optical gain generating means. A photoelectric conversion element including the second optical gain generating means lattice matched with InP is suitable for laser oscillation at a wavelength range near 1550 nm, which is one of communication wavelength ranges.

Fifth Embodiment

Figure 9:
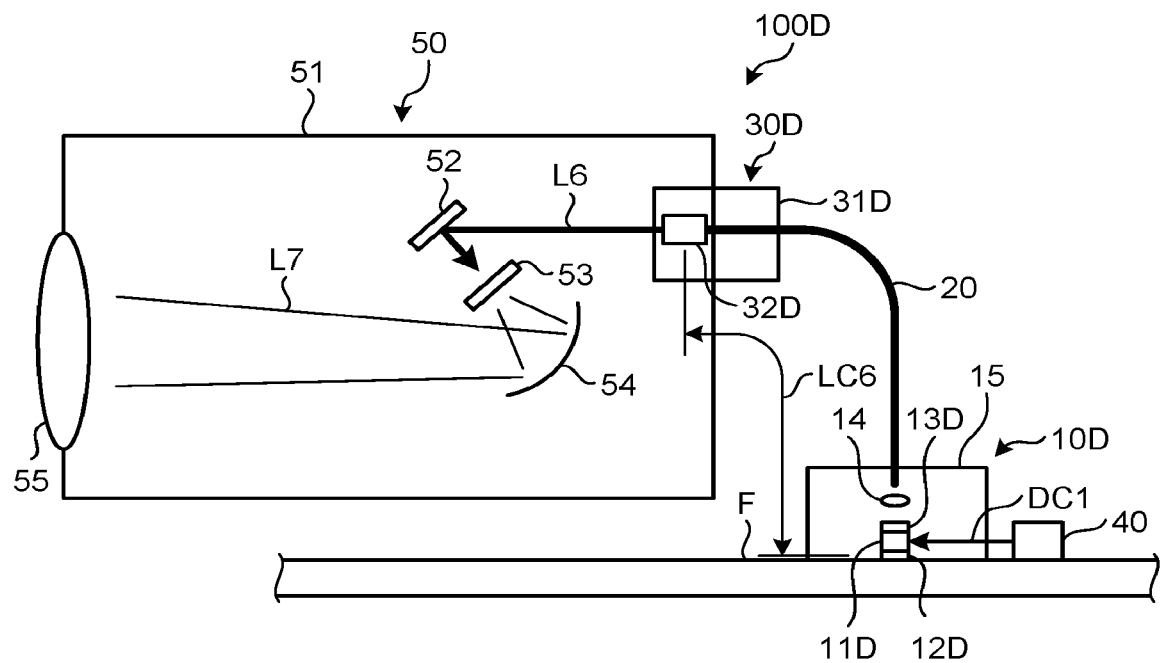
FIG. 9 is a diagram illustrating a schematic configuration of an optical power transmission apparatus according to a fifth embodiment.

An optical power transmission apparatus that uses, as is, light transmitted through an optical fiber, without converting the optical power into electricity, will be described as a fifth embodiment. FIG. 9 is a diagram illustrating a schematic configuration of the optical power transmission device according to the fifth embodiment. An optical power transmission apparatus 100D has a configuration corresponding to the configuration of the optical power transmission apparatus 100 illustrated in FIG. 1, with the light emitting unit 10 replaced with a light emitting unit 10D, the light receiving unit 30 replaced with a light receiving unit 30D, and a headlight unit 50 added. The optical power transmission apparatus 100D is applied to a laser headlight of an automobile. Laser head lights have an advantage that the spot size of light is able to be made small, high-intensity lighting is enabled, and bright illumination over a long distance of some hundreds of meters is enabled.

The light emitting unit 10D has a configuration corresponding to the configuration of the light emitting unit 10, with the semiconductor optical amplifier 11 replaced with a semiconductor optical amplifier 11D, the reflecting mirror 12 replaced with a reflecting mirror 12D, and the low-reflecting coating 13 replaced with a low-reflecting coating 13D.

A composition of the material and the structure of the semiconductor optical amplifier 11D are adjusted such that its gain wavelength band includes 400 nm, which is a blue wavelength (360 nm to 480 nm). The reflecting mirror 12D is, for example, a dielectric multilayer coating, and is configured to have a high reflectivity of 95% at the wavelength of 400 nm. The low-reflecting coating 13D is, for example, a dielectric multilayer coating and is configured to have a very low reflectivity of 0.1% at the wavelength of 440 nm.

The light emitting unit 10D is attached to a member having high heat dissipation performance in an automobile, a frame F of the body of a car in this embodiment.

The light receiving unit 30D includes a housing 31D, and a reflecting mirror 32D housed in the housing 31D. The reflecting mirror 32D is a second light reflecting means. The optical fiber 20 is inserted in the housing 31D and is fixed to the housing 31D such that one end of the optical fiber 20 is near and opposed to the reflecting mirror 32D. The optical fiber 20 and the reflecting mirror 32D are thereby optically connected to each other. Similarly to the reflecting mirror 32 illustrated in FIG. 1, the reflecting mirror 32D is, for example, an optical plate (for example, a glass plate) having a dielectric multilayer coating formed thereon, and is configured to transmit a large proportion of light and have a reflectivity of 5%, at the wavelength of 400 nm.

By being optically connected in the order of the reflecting mirror 12D of the light emitting unit 10D, the optical fiber 20, and the reflecting mirror 32D; the reflecting mirror 12D, the optical fiber 20, and the reflecting mirror 32D form a laser resonator LC6 at the wavelength of 400 nm. The laser resonator LC6 is a first laser resonator. The semiconductor optical amplifier 11D is arranged in the laser resonator LC6. In a state where the semiconductor optical amplifier 11D is being supplied with the driving current DC1 from the driving device 40 and generating optical gain, laser oscillation is caused by the laser resonator LC6, and laser light L6 generated by the laser oscillation is output from the reflecting mirror 32D. As a result, high optical power due to the laser oscillation is transmitted as the laser light L6 from the light emitting unit 10D to the light receiving unit 30D, via the optical fiber 20. The laser light L6 is first laser light.

The headlight unit 50 includes a housing 51, a reflecting mirror 52, a light emitting unit 53, a reflecting mirror 54, and a projection lens 55. The housing 51 is made of, for example, resin, and houses the reflecting mirror 52, the light emitting unit 53, and the reflecting mirror 54, and the projection lens 55 is attached to the housing 51 such that the projection lens 55 is exposed outside. Furthermore, the light receiving unit 30D is attached to the housing 51.

The reflecting mirror 52 reflects the laser light L6 output from the light receiving unit 30D to the light emitting unit 53. The light emitting unit 53 is made of a resin including a known fluorescent material that absorbs blue light and emits yellow light in the complementary color of blue light. Therefore, the light emitting unit 53 absorbs part of the laser light L6 and emits yellow light having a wavelength different from that of the laser light L6. The light emitting unit 53 thereby outputs white light L7. The reflecting mirror 54 is a concave mirror, condenses the white light L7, and reflects the condensed white light L7 to the projection lens 55. The projection lens 55 condenses the white light L7 and outputs the condensed white light L7 outside. The configuration of the light emitting unit 53 is just an example, and is not limited to this example.

Similarly to the optical power transmission apparatus 100, the optical power transmission apparatus 100D enables, with a noncomplex configuration, the laser light L6 to be prevented from leaking outside and a high level of safety to be maintained. Furthermore, a space enabling installation of the light emitting unit 10D near the headlight unit 50 may be unable to be obtained in an automobile. This optical power transmission apparatus 100D has an advantage because the light emitting unit 10D is installed at an installable place and optical power is able to be transmitted from the installable place to the light receiving unit 30D installed at the headlight unit 50 via the optical fiber 20.

Furthermore, the optical power transmission apparatus 100D has a desirable configuration in terms of countermeasures against heat.

Figure 10:
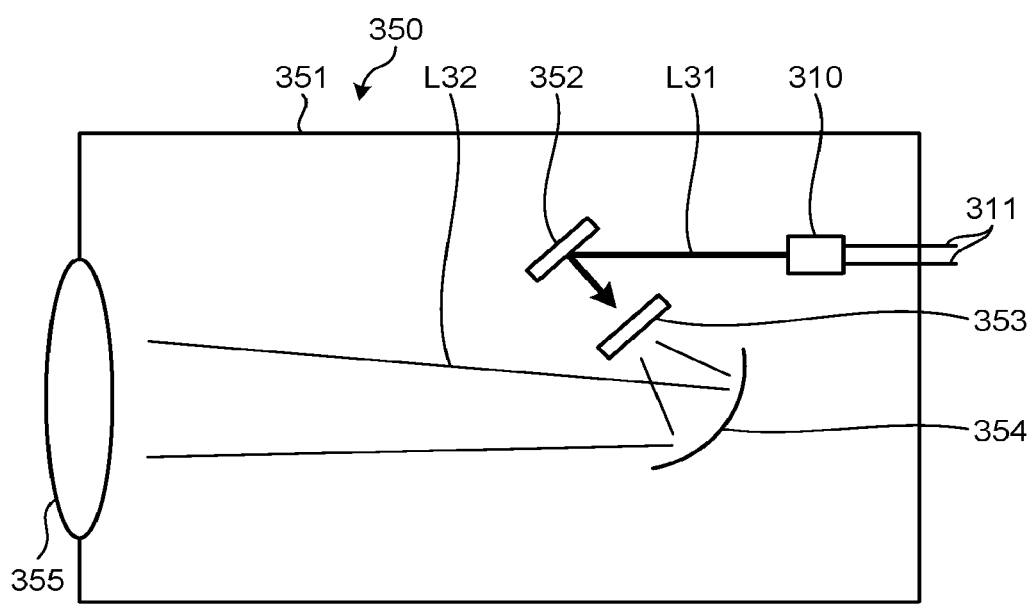
FIG. 10 is a diagram illustrating a schematic configuration of a headlight unit.

For example, FIG. 10 is a diagram illustrating a schematic configuration of a headlight unit with a built-in blue laser light source. This headlight unit 350 has a blue laser light source 310 housed in a housing 351. The blue laser light source 310 is supplied with electric current from a terminal 311 and outputs blue laser light L31. A reflecting mirror 352 reflects the laser light L31 output from the blue laser light source 310 to a light emitting unit 353. The light emitting unit 353 absorbs part of the laser light L31 and emits yellow light in the complementary color thereof, thereby outputting white light L32. A reflecting mirror 354 is a concave mirror, condenses the white light L32 and reflects the condensed white light L32 to a projection lens 355. The projection lens 355 condenses the white light L32 and outputs the condensed white light L32 outside.

This headlight unit 350 has a structure in which the high intensity blue laser light source 310 is incorporated in the highly sealable housing 351, and thus has a problem in the heat dissipation performance for heat generated by the blue laser light source 310. In contrast, in the optical power transmission apparatus 100D, the light emitting unit 10D is installed in close contact with a member having high heat dissipation performance, such as the frame F, and optical power is transmitted as the laser light L6 via the optical fiber 20 to near the light emitting unit 53 of the headlight unit 50.

Furthermore, if the optical fiber 20 is detached, laser oscillation is stopped. As a result, a laser headlight system that has excellent heat dissipation performance and is safe is able to be provided.

In the above described embodiments, the first optical gain generating means is a semiconductor optical amplifier, but the first optical gain generating means may be another optical gain generating means used in a solid-state laser, such as a YAG rod, for example. In this case, the energy supplying means is, for example, a laser light source, and energy that causes the YAG rod to generate gain is supplied via light.

The present disclosure is not limited by the above described embodiments. Those configured by combination of any of the above described components of the embodiments as appropriate are also included in the present disclosure. Furthermore, further effects and modifications can be easily derived by those skilled in the art. Therefore, wider aspects of the present disclosure are not limited to the above described embodiments, and various modifications may be made.

As described above, the present disclosure is suitable for application to optical power transmission using optical fiber.

The present disclosure has an effect of maintaining a high level of safety with a noncomplex configuration and enabling optical power transmission over a long distance or to a non-line-of-sight place.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

The invention claimed is:

1. An optical power transmission apparatus, comprising:
a light emitting unit including a first optical gain generating means and a first light reflecting means;
an optical fiber;
a second light reflecting means; and
a light receiving means, wherein
the second light reflecting means is arranged nearer to the light receiving means than the optical fiber is,
a first laser resonator is formed, between the first light reflecting means and the second light reflecting means, by optical connection between the first optical gain generating means and the optical fiber,
first laser light generated by the first laser resonator is configured to be incident on the light receiving means, and
the optical fiber is configured to be able to be optically decoupled from the second light reflecting means.

2. An optical power transmission apparatus, comprising:
a light emitting unit including a first optical gain generating means and a first light reflecting means;
an optical fiber;
a second light reflecting means; and
a light receiving means, wherein
the second light reflecting means is arranged nearer to the light receiving means than the optical fiber is,
a first laser resonator is formed, between the first light reflecting means and the second light reflecting means, by optical connection between the first optical gain generating means and the optical fiber,
first laser light generated by the first laser resonator is configured to be incident on the light receiving means,
the second light reflecting means and the light receiving means are fixed to each other to form a light receiving unit,
the optical fiber has a first fixing unit near the light receiving unit,
the light receiving unit has a second fixing unit, and
the first fixing unit is detachably connected to the second fixing unit that is installed at a predetermined position enabling optical connection between the optical fiber and the second light reflecting means.

3. An optical power transmission apparatus, comprising:
a light emitting unit including a first optical gain generating means and a first light reflecting means;
an optical fiber;
a second light reflecting means; and
a light receiving means, wherein
the second light reflecting means is arranged nearer to the light receiving means than the optical fiber is,
a first laser resonator is formed, between the first light reflecting means and the second light reflecting means, by optical connection between the first optical gain generating means and the optical fiber,
first laser light generated by the first laser resonator is configured to be incident on the light receiving means,
the second light reflecting means and the light receiving means are fixed to each other to form a light receiving unit,
the light receiving unit includes a second laser resonator, and a second optical gain generating means that is arranged in the second laser resonator and generates optical gain by being supplied with energy,
the second optical gain generating means receives the first laser light and generates optical gain, and
laser oscillation is caused by the second laser resonator, and second laser light generated by the laser oscillation is configured to be output from the second laser resonator.

4. The optical power transmission apparatus according to claim 3, wherein the second optical gain generating means is formed of an optical material including yttrium aluminum garnet (YAG).

5. The optical power transmission apparatus according to claim 3, wherein the second optical gain generating means includes a semiconductor material lattice matched with gallium arsenide (GaAs).

6. The optical power transmission apparatus according to claim 3, wherein the second optical gain generating means includes a semiconductor material lattice matched with indium phosphide (InP).

* * * * *